(12) United States Patent
Kazem et al.

(10) Patent No.: US 11,335,622 B2
(45) Date of Patent: May 17, 2022

(54) METHOD, APPARATUS, AND ASSEMBLY FOR THERMALLY CONNECTING LAYERS

(71) Applicant: Arieca Inc., Pittsburgh, PA (US)

(72) Inventors: Navid Kazem, Pittsburgh, PA (US);
Carmel Majidi, Pittsburgh, PA (US)

(73) Assignee: ARIECA INC., Pittsburgh, PA (US)

( * ) Notice: Subject to any disclaimer, the term of this patent is extended or adjusted under 35 U.S.C. 154(b) by 2 days.

(21) Appl. No.: 17/006,111

(22) Filed: Aug. 28, 2020

(65) Prior Publication Data

US 2021/0272873 A1    Sep. 2, 2021

Related U.S. Application Data

(62) Division of application No. 15/930,519, filed on May 13, 2020, now Pat. No. 10,777,483.

(60) Provisional application No. 62/983,133, filed on Feb. 28, 2020.

(51) Int. Cl.
*H01L 23/373* (2006.01)
*H01L 21/48* (2006.01)
*H01L 23/367* (2006.01)

(52) U.S. Cl.
CPC ...... *H01L 23/3733* (2013.01); *H01L 21/4882* (2013.01); *H01L 23/3675* (2013.01)

(58) Field of Classification Search
CPC ............. H01L 23/3733; H01L 23/3675; H01L 21/4882
See application file for complete search history.

(56) References Cited

U.S. PATENT DOCUMENTS

| | | | |
|---|---|---|---|
| 6,248,151 B1 * | 6/2001 | Horine | B41J 2/14008 427/565 |
| 6,797,758 B2 | 9/2004 | Misra et al. | |
| 7,141,273 B2 | 11/2006 | Endo et al. | |
| 7,726,545 B2 * | 6/2010 | Ichiryu | H01L 21/6835 228/180.22 |
| 7,799,607 B2 * | 9/2010 | Karashima | H01L 24/16 438/108 |
| 9,308,571 B2 | 4/2016 | Kempers et al. | |
| 10,199,302 B1 * | 2/2019 | Sanchez | H01L 21/4842 |
| 2003/0052156 A1 | 3/2003 | Kim et al. | |
| 2005/0228097 A1 | 10/2005 | Zhong | |
| 2007/0042533 A1 | 2/2007 | Endo et al. | |
| 2007/0117270 A1 | 5/2007 | Renavikar et al. | |
| 2007/0131055 A1 | 6/2007 | Cheng et al. | |
| 2007/0238282 A1 | 10/2007 | Furman et al. | |
| 2008/0023665 A1 | 1/2008 | Weiser et al. | |

(Continued)

FOREIGN PATENT DOCUMENTS

| | | |
|---|---|---|
| CN | 104031600 A | 9/2014 |
| CN | 104031600 B | 3/2016 |

(Continued)

*Primary Examiner* — Nathan W Ha
(74) *Attorney, Agent, or Firm* — K&L Gates LLP (57) ABSTRACT

A die of an integrated circuit and an upper layer of a circuit assembly are thermally connected by applying a thermal interface material (TIM) on the die, such that the TIM is between the die and an upper layer. The TIM comprises an emulsion of liquid metal droplets and uncured polymer. The method further comprises compressing the circuit assembly thereby deforming the liquid metal droplets and curing the thermal interface material thereby forming the circuit assembly.

16 Claims, 6 Drawing Sheets

(56) References Cited

U.S. PATENT DOCUMENTS

| | | |
|---|---|---|
| 2008/0291634 A1 | 11/2008 | Weiser et al. |
| 2011/0024101 A1* | 2/2011 | Han .................... H01L 21/4882 165/185 |
| 2011/0038124 A1 | 2/2011 | Burnham et al. |
| 2014/0264820 A1 | 9/2014 | Hu et al. |
| 2014/0374897 A1* | 12/2014 | Zhao ................. H01L 21/02112 257/713 |
| 2015/0101785 A1* | 4/2015 | Ho ...................... H01L 21/4882 165/170 |
| 2016/0219751 A1 | 7/2016 | Kempers |
| 2017/0179002 A1* | 6/2017 | Chainer ............... H01L 23/427 |
| 2017/0200667 A1 | 7/2017 | John et al. |
| 2017/0218167 A1 | 8/2017 | Majidi et al. |
| 2018/0090411 A1 | 3/2018 | Cetegen et al. |
| 2018/0269128 A1* | 9/2018 | Limaye ............... H01L 23/3672 |
| 2018/0323130 A1 | 11/2018 | Liu et al. |
| 2018/0374714 A1* | 12/2018 | Stathakis ............. H01L 23/373 |
| 2019/0172726 A1* | 6/2019 | Berntson ............ H01L 21/4882 |
| 2019/0181069 A1 | 6/2019 | Rykaczewski et al. |
| 2019/0221495 A1 | 7/2019 | Divakar et al. |
| 2019/0221498 A1 | 7/2019 | Wu et al. |
| 2019/0348345 A1* | 11/2019 | Parida ................. F28D 15/0233 |
| 2020/0168523 A1* | 5/2020 | Huang ................ H01L 21/4871 |
| 2020/0219786 A1* | 7/2020 | Hung ................. H01L 21/4882 |
| 2020/0227338 A1* | 7/2020 | Gong ..................... F28F 21/02 |
| 2020/0227339 A1* | 7/2020 | Schwab ........... H01L 23/49568 |
| 2020/0263285 A1* | 8/2020 | Stowell .................... H05H 1/30 |
| 2020/0328007 A1 | 10/2020 | Majidi et al. |
| 2020/0362218 A1 | 11/2020 | Kazem et al. |
| 2021/0125896 A1 | 4/2021 | Arrington et al. |
| 2021/0126246 A1* | 4/2021 | Gazda ............... H01M 10/0525 |

FOREIGN PATENT DOCUMENTS

| | | |
|---|---|---|
| CN | 107393627 A | 11/2017 |
| CN | 107501953 A | 12/2017 |
| CN | 110564157 A | 12/2019 |
| EP | 0696630 A2 | 2/1996 |
| JP | 2003-234586 A | 8/2003 |
| JP | 2003234586 | 8/2003 |
| JP | 2008-306202 A | 12/2008 |
| KR | 102176691 B1 | 11/2020 |
| WO | 2017165608 A1 | 9/2017 |
| WO | WO 2019/136252 A1 | 7/2019 |

\* cited by examiner

METHOD, APPARATUS, AND ASSEMBLY FOR THERMALLY CONNECTING LAYERS

CROSS REFERENCE

The subject application is a divisional application of U.S. patent application Ser. No. 15/930,519, filed May 13, 2020, which claims priority to U.S. provisional patent application Ser. No. 62/983,133, filed Feb. 28, 2020, both having the same title and inventors as indicated above, and which are incorporated herein by reference in their entirety.

FIELD

The present disclosure relates to a method, apparatus, and assembly for thermally connecting two layers.

BACKGROUND

A thermal interface material (TIM) can be used to thermally connect two or more layers together. For example, TIMs are often used in CPU packages to thermally connect the CPU die to the integrated heat spreader (IHS) of the CPU package. There are various types of TIMs that may be used. However, current TIMs present challenges.

SUMMARY

In one general aspect, the present invention is directed to a method for thermally connecting a die and an upper layer. The method comprises applying a thermal interface material on a die of an integrated circuit, such that the thermal interface material is between the die and an upper layer of a circuit assembly. In various examples, the integrated circuit can be a processor, an ASIC, or a system-on-a-chip (SOC). In certain examples, the upper layer can be an integrated heat spreader, a heat sink, or packaging. The thermal interface material applied to the die comprises an emulsion of liquid metal droplets and uncured polymer. The method comprises compressing the circuit assembly thereby deforming the liquid metal droplets and curing the thermal interface material thereby forming the circuit assembly.

In another general aspect, the present invention is directed to an integrated circuit assembly comprising a die, an upper layer, and a thermal interface material disposed in contact with the die layer and the upper layer. The thermally interface material comprises a polymer and liquid metal droplets dispersed throughout the polymer. A bondline distance formed between the die and the upper layer is no greater than 150 microns.

In another general aspect, the present invention is directed to an apparatus for thermally connecting a die and an upper layer, the apparatus comprising a container defining a cavity and an emulsion disposed in the cavity. The emulsion comprises liquid metal droplets and uncured polymer, and wherein the container is configured to enable application of the emulsion onto a die of an integrated circuit.

In another general aspect, the present invention is directed to a method for thermally connecting a two or more layers. The method comprises applying a thermal interface material on a first layer, such that the thermal interface material is between a first layer and a second layer of an assembly. The thermal interface material comprises an emulsion of liquid metal droplets and uncured polymer. The method comprises compressing the assembly thereby deforming the liquid metal droplets and curing the thermal interface material thereby forming the assembly The present invention can provide both a low contact resistance at the material interfaces and a low thermal resistance through the material. The low contact resistance can be enabled by the application of the polymer in an uncured state so that the polymer and liquid metal droplets can conform to the surface of the layer to achieve a desired contact resistance. The low thermal resistance through the material can be enabled by liquid metal droplets, including the size and/or shape of the liquid metal droplets. Additionally, the methods described herein may not need as high a pressure to install as compared to methods due to application of the polymer in the uncured state. Further, curing the polymer can inhibit pump out of the liquid metal droplets. These and other benefits realizable from various embodiments of the present invention will be apparent from the description that follows.

BRIEF DESCRIPTION OF THE DRAWINGS

The features and advantages of various examples of the present invention, and the manner of attaining them, will become more apparent, and the examples will be better understood by reference to the following description of examples taken in conjunction with the accompanying drawing, wherein.

Corresponding reference characters indicate corresponding parts throughout the several views. The exemplifications set out herein illustrate certain examples, in one form, and such exemplifications are not to be construed as limiting the scope of the examples in any manner.

DETAILED DESCRIPTION

Certain exemplary aspects of the present invention will now be described to provide an overall understanding of the principles of the composition, function, manufacture, and use of the compositions and methods disclosed herein. An example or examples of these aspects are illustrated in the accompanying drawing. Those of ordinary skill in the art will understand that the compositions, articles, and methods specifically described herein and illustrated in the accompanying drawing are non-limiting exemplary aspects and that the scope of the various examples of the present invention is defined solely by the claims. The features illustrated or described in connection with one exemplary aspect may be combined with the features of other aspects. Such modifications and variations are intended to be included within the scope of the present invention.

Applying a material to a die of an integrated circuit such that the material is between the die and an integrated heat spreader (IHS) can require balancing the thermal resistance through the material and the contact resistance at the material interfaces. For example, a polymeric material may have a low contact resistance at the material interfaces but a high thermal resistance through the material. A solid metal may have a low thermal resistance through the material but a high contact resistance at the material interfaces. Additionally, some solid materials (polymeric or metal) may require a large pressure during installation to achieve a desired contact resistance. Thus, the present invention provides, in various embodiments, a thermal interface material (TIM), an assembly for thermally connecting two layers, and a circuit assembly that can provide both a low contact resistance at the material interfaces and a low thermal resistance through the material. Additionally, the TIM may not need as high a pressure to install as compared to other solid materials. For example, the TIM may require a pressure of less than or equal to 50 pounds per square inch to install (e.g., compress). The TIM according to the present disclosure can comprise a polymer with liquid metal droplets dispersed through the polymer.

As used in this specification, the terms "polymer" and "polymeric" means prepolymers, oligomers, and both homopolymers and copolymers. As used in this specification, "prepolymer" means a polymer precursor capable of further reactions or polymerization by a reactive group or reactive groups to form a higher molecular mass or cross-linked state.

The polymer can be a thermosetting polymer, a thermoplastic polymer, or a combination thereof. As used herein, the term "thermosetting" refers to polymers that "set" irreversibly upon curing or cross-linking, where the polymer chains of the polymeric components are joined together by covalent bonds, which is often induced, for example, by heat or radiation. In various examples, curing or a cross-linking reaction can be carried out under ambient conditions. Once cured or cross-linked, a thermosetting polymer may not melt upon the application of heat and can be insoluble in conventional solvents. As used herein, the term "thermoplastic" refers to polymers that include polymeric components in which the constituent polymer chains are not joined (e.g., crosslinked) by covalent bonds and thereby can undergo liquid flow upon heating and are soluble in conventional solvents. In certain embodiments, the polymer can be elastomeric (e.g., rubbery, soft, stretchy) or rigid (e.g., glassy). For example, the polymer can be elastomeric.

Thermosetting polymers may include a cross-linking agent that may comprise, for example, aminoplasts, polyisocyanates (including blocked isocyanates), polyepoxides, beta-hydroxyalkylamides, polyacids, anhydrides, organometallic acid-functional materials, polyamines, polyamides, or a combination thereof. A polymer may have functional groups that are reactive with the cross-linking agent.

The polymer in the TIMs described herein may be selected from any of a variety of polymers well known in the art. For example, the thermosetting polymer may comprise an acrylic polymer, a polyester polymer, a polyurethane polymer, a polyamide polymer, a polyether polymer, a polysiloxane polymer (e.g., poly(dimethylsiloxone)), a fluoropolymer, a polyisoprene polymer (e.g., rubber), a copolymer thereof (e.g., styrene ethylene butylene styrene), or a combination thereof. The functional groups on a thermosetting polymer may be selected from any of a variety of reactive functional groups, including, for example, a carboxylic acid group, an amine group, an epoxide group, a hydroxyl group, a thiol group, a carbamate group, an amide group, a urea group, an isocyanate groups (including a blocked isocyanate group), a mercaptan group, and a combination thereof.

The thermoplastic polymer can comprise propylene-ethylene co-polymer, styrene-butadiene-styrene, styrene ethylene butylene styrene, or a combination thereof. The polymer can comprise a melting point of at least 100 degrees Celsius, such as, for example, at least 120 degrees Celsius, at least 150 degrees Celsius, or at least 200 degrees Celsius.

The liquid metal for the TIM can comprise gallium, a gallium alloy, indium, an indium alloy, tin, a tin alloy, mercury, a mercury alloy, or a combination thereof. The liquid metal can be in the liquid phase at least at a temperature of at least −20 degrees Celsius (e.g., in its bulk form, can comprise a melting point of less than −20 degrees Celsius), such as, for example, at least −19 degrees Celsius, at least −10 degrees Celsius, at least 0 degrees Celsius, at least 5 degrees Celsius, at least 10 degrees Celsius, at least 15 degrees Celsius, at least 20 degrees Celsius, or at least 25 degrees Celsius. The liquid metal can be in the liquid phase at least at a temperature of no greater than 30 degrees Celsius (e.g., in its bulk form, can comprise a melting point of less than 30 degrees Celsius), such as, for example, no greater than 25 degrees Celsius, no greater than 20 degrees Celsius, no greater than 15 degrees Celsius, no greater than 10 degrees Celsius, no greater than 5 degrees Celsius, no greater than 0 degrees Celsius, or no greater than −10 degrees Celsius. The liquid metal can be in the liquid phase at least at a temperature in a range of −20 degrees Celsius to 30 degrees Celsius (e.g., in its bulk form, can comprise a melting point of less than a temperature in a range of −20 degrees Celsius to 30 degrees Celsius), such as, for example, −19 degrees Celsius to 30 degrees Celsius, −19 degrees Celsius to 25 degrees Celsius, or −19 degrees Celsius to 20 degrees Celsius. The determination of whether the liquid phase is achieved at the respective temperature can be made at a pressure of 1 atmosphere absolute. In certain embodiments, the TIM can comprise Gallium Indium Tin (Galinstan) and a melting point of −19 degrees Celsius.

The TIM can be created by forming an emulsion of the polymer and the liquid metal such that liquid metal droplets are substantially dispersed throughout the polymer. For example, the polymer and liquid metal droplets can be mixed together with a high shear mixer, a centrifugal mixer, by shaking in a container, a mortar and pestle, sonication, or a combination thereof. More details about exemplary ways to form the emulsion are described in (1) published PCT WO/2019/136252, entitled "Method of Synthesizing a Thermally Conductive and Stretchable Polymer Composite" and (2) published U.S. application US 2017/0218167, entitled "Polymer Composite with Liquid Phase Metal Inclusions," both of which are assigned to Carnegie Mellon University and both which are incorporated herein by reference in their entirety. The composition and/or mixing techniques can be chosen such that the viscosity of the TIM emulsion in an uncured state is less than 250,000 cP (centipoise), such as, for example, less than 200,000 cP, less than 150,000 cP, less than 100,000 cP, less than 50,000 cP, less than 15,000 cP, less than 14,000 cP, less than 13,000 cP, less than 12,000 cP, less than 11,000 cP, or less than 10,000 cP. The viscosity of the TIM emulsion can be measured by a rotary viscometer or a cone and plate viscometer at room temperature. The viscosity measurement can be performed at a select frequency suitable to produce a static viscosity (e.g., since the material is a non-newtonian fluid).

The TIM can comprise at least 1% liquid metal droplets by total volume of the TIM, such as, for example, at least 5% liquid metal droplets, at least 10% liquid metal droplets, at least 20% liquid metal droplets, at least 30% liquid metal droplets, at least 40% liquid metal droplets, at least 50% liquid metal droplets, or at least 60% liquid metal droplets, all based on the total volume of the liquid metal droplets. The TIM can comprise no greater than 90% liquid metal droplets by total volume of the TIM, such as, for example, no greater than 60% liquid metal droplets, no greater than 50% liquid metal droplets, no greater than 40% liquid metal droplets, no greater than 30% liquid metal droplets, no greater than 20% liquid metal droplets, or no greater than 10% liquid metal droplets, all based on the total volume of the TIM. The TIM can comprise a range of 1% to 90% liquid metal droplets by total volume of the TIM, such as, for example, 5% to 50% liquid metal droplets, 40% to 60% liquid metal droplets, 5% to 90% liquid metal droplets, or 30% to 50% liquid metal droplets, all based on the total volume of the TIM.

The composition and/or mixing techniques can be selected to achieve a desired average particle size of the liquid metal droplets in the TIM. The average particle size of the liquid metal droplets can be at least 1 micron, such as, for example, at least 5 microns, at least 10 microns, at least 20 microns, at least 30 microns, at least 35 microns, at least 40 microns, at least 50 microns, at least 60 microns, at least 70 microns, at least 80 microns, at least 90 microns, at least 100 microns, at least 120 microns, or at least 150 microns. The average particle size of the liquid metal droplets can be no greater than 200 micron, such as, for example, no greater than 150 microns, no greater than 120 microns, no greater than 100 microns, no greater than 90 microns, no greater than 80 microns, no greater than 70 microns, no greater than 60 microns, no greater than 50 microns, no greater than 40 microns, no greater than 35 microns, no greater than 30 microns, no greater than 20 microns, no greater than 10 microns, or no greater than 5 microns. For example, the average particle size of the liquid metal droplets can be in a range of 1 microns to 200 microns, such as, for example, 5 microns to 150 microns, 35 microns to 150 microns, 35 microns to 70 microns, or 5 microns to 100 microns.

As used herein, "average particle size" refers to the mean average size measured using microscopy (e.g., optical microscopy or electron microscopy). The size can be the diameter of spherical particles or the length along the largest dimension if ellipsoidal or otherwise irregularly shaped particle.

The polydispersity of the liquid metal droplets can be unimodal or multimodal (e.g., bimodal, trimodal). Utilizing a multimodal polydispersity can increase the packing density of the liquid metal droplets in the TIM. In certain embodiments where the polydispersity is unimodal, the polydispersity of the liquid metal droplets in the polymer can be in a range of 0.3 to 0.4.

Figure 1:
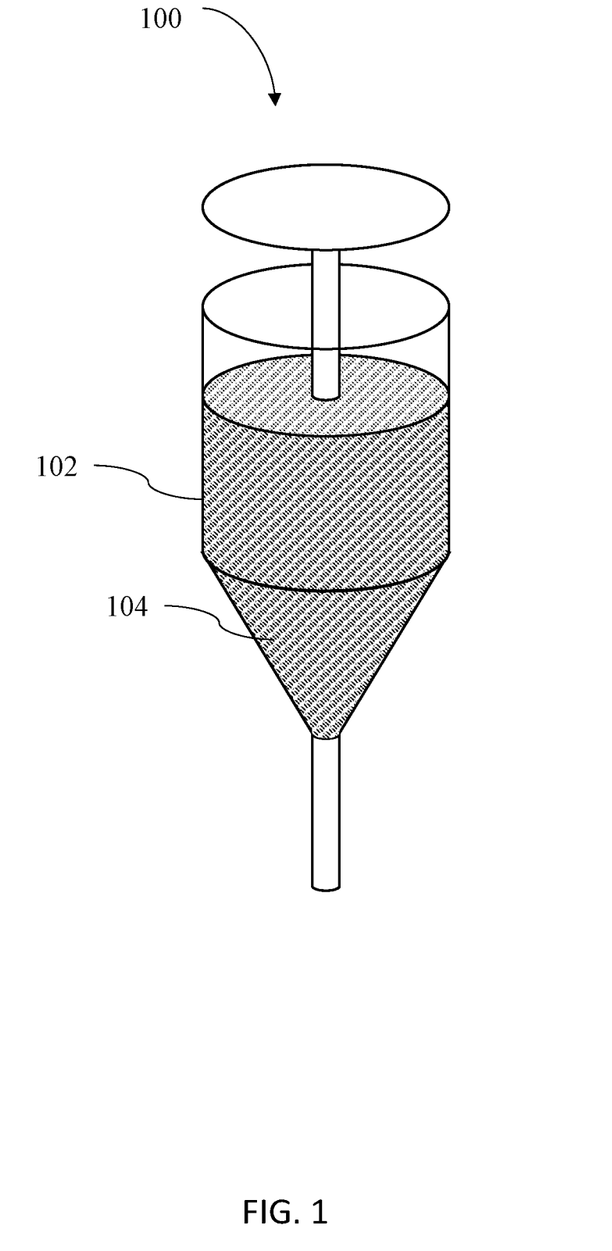
FIG. 1 is a schematic diagram of a container comprising a TIM emulsion according to the present disclosure.

The TIM can be stored in a container 100 as illustrated in FIG. 1 prior to use. For example, the container can comprise walls 102 defining a cavity and the TIM emulsion 104 can be stored in the cavity. The TIM 104 can be in an uncured state in the container 100. Storage of the TIM 104 in the container 100 can inhibit curing of the TIM 104. The container 100 can be a pillow pack, a syringe, a beaker, a jar, a bottle, a drum, or a combination thereof. In various examples, the container 100 can be a ready to use dispensing device, such as, for example, a pillow pack or a syringe. In other examples, the TIM 104 may not be stored and can be used after creation of the emulsion without storage.

As used in this specification, the terms "cure" and "curing" refer to the chemical cross-linking of components in an emulsion or material applied over a substrate or the increase of viscosity of the components in the emulsion or material applied over the substrate. Accordingly, the terms "cure" and "curing" do not encompass solely physical drying of an emulsion or material through solvent or carrier evaporation. In this regard, the term "cured," as used in this specification in examples comprising a thermosetting polymer, refers to the condition of an emulsion or material in which a component of the emulsion or material has chemically reacted to form new covalent bonds in the emulsion or material (e.g., new covalent bonds formed between a binder resin and a curing agent). The term "cured", as used in this specification in examples comprising a thermoplastic polymer, refers to the condition of an emulsion or material in which the temperature of the thermoplastic polymer decreases below the melting point of the thermoplastic polymer such that the viscosity of the emulsion or material increases. In examples comprises both a thermosetting polymer and a thermoplastic polymer, the term "cured" refers to one of or both of the polymers curing as described herein.

Curing of a thermosetting polymer can be achieved by applying a temperature of at least −20 degrees Celsius to the TIM 104, such as, for example, at least 10 degrees Celsius, at least 50 degrees Celsius, at least 100 degrees Celsius, or at least 150 degrees Celsius. Curing can be achieved by applying a temperature of no greater than 300 degrees Celsius to the TIM 104, such as, for example, no greater than 250 degrees Celsius, no greater than 200 degrees Celsius, no greater than 150 degrees Celsius, no greater than 100 degrees Celsius, or no greater than 50 degrees Celsius. Curing can be achieved by applying a temperature in a range of −20 degrees Celsius to 300 degrees Celsius to the TIM 104, such as, for example, 10 degrees Celsius to 200 degrees Celsius or 50 degrees Celsius to 150 degrees Celsius. For example, curing can comprise thermally baking the TIM. The temperature can be applied for a time period of greater than 1 minute, such as, for example, greater than 5 minutes, greater than 30 minutes, greater than 1 hour, or greater than 2 hours.

The TIM 104 can be dispensed from the container 100 and applied to a layer in an uncured state. Thereafter, the TIM 104 can be cured to form a cured TIM 104. Curing the TIM 104 can comprise heating the TIM 104 (e.g., in examples with a thermosetting polymer), adding a catalyst to the TIM 104, exposing the TIM 104 to air, cooling the TIM 104 (e.g., in examples with a thermoplastic polymer), applying pressure to the TIM 104, or a combination thereof. Curing the TIM 104 can increase the viscosity of the TIM emulsion to greater than 15,000 cP, such as, for example, greater than 20,000 cP, greater than 30,000 cP, greater than 50,000 cP, greater than 100,000 cP, greater than 150,000 cP, greater than 200,000 cP, or greater than 250,000 cP. For example, the polymer in the TIM 104 can be cured. In various examples, the TIM 104 can be an adhesive. The polymer in the TIM 104 can be selected to reduce off-gasing of the TIM 104 during curing.

The TIM according to the present disclosure can be applied to a first layer such that the TIM is between two layers of an assembly including the first layer and a second layer. The first layer can be a heat-generating electronic component (e.g., integrated circuit) and the second layer can be an upper layer that can be thermally conductive. For example, the upper layer can be a heat spreader, a heat sink, or packaging. Thereafter, the assembly can be compressed thereby deforming the liquid metal droplets in the TIM and the TIM can be cured to form the assembly. Applying the TIM 104 in an uncured state can achieve a desired contact resistance and enable lower pressures to be used when compressing an assembly. The TIM can be applied to various layers and devices and it described below with reference to FIGS. 2A-B with reference to a circuit assembly but is not limited to only a circuit assembly.

Figure 2A:
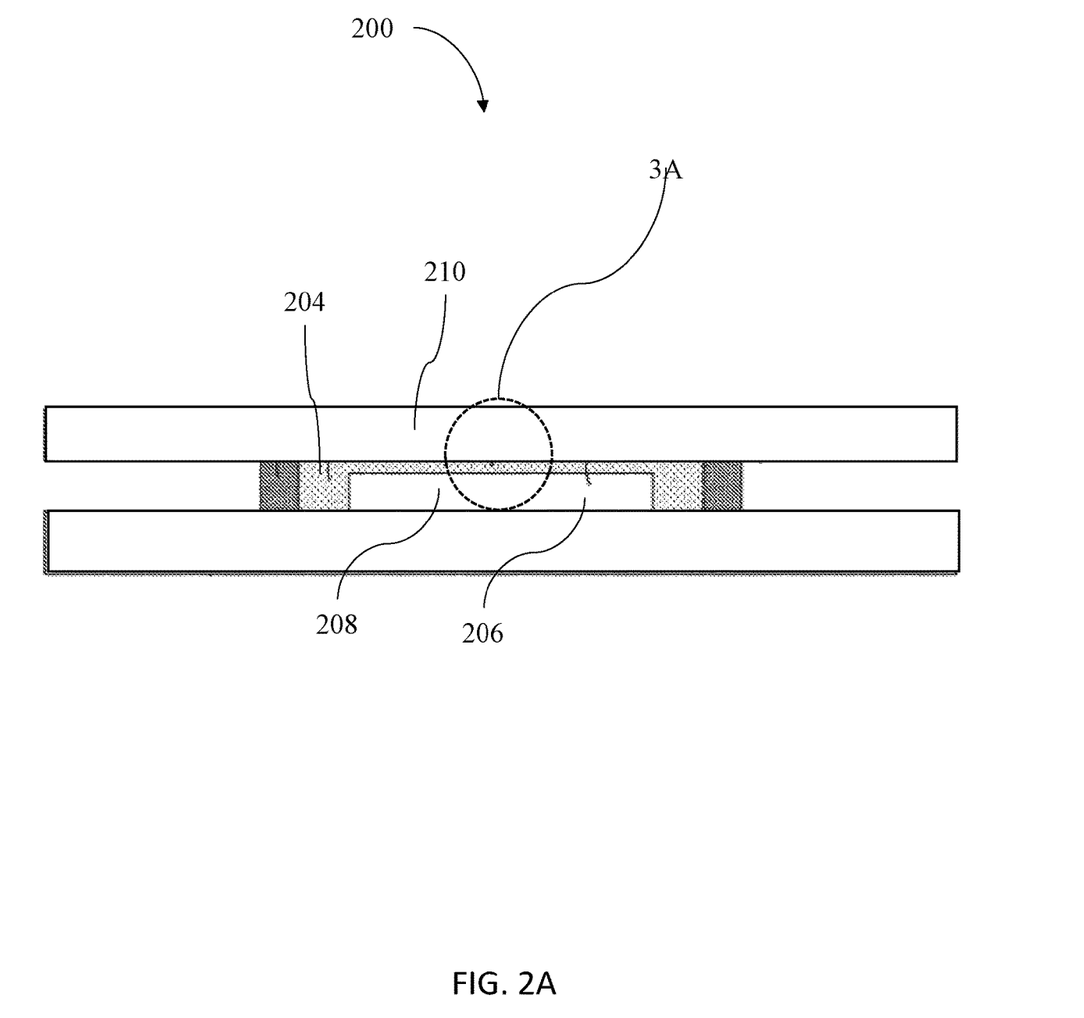
FIG. 2A is a side cross-section view of a circuit assembly comprising a TIM according to the present disclosure.

Referring to FIG. 2A, a TIM 204 can be applied to a die 206 of an integrated circuit 208 such that the TIM 204 can be between the die 206 and an upper layer 210 of a circuit assembly 200. Applying the TIM 204 to the die 206 can comprise spray coating, spin coating, dip coating, roll coating, flow coating, film coating, brush coating, extrusion, dispensing, or a combination thereof. The TIM 204 can be applied in an uncured state such that the TIM is conformable to the surfaces of the die 206 and the upper layer 210 such that a desired level of surface contact therebetween can be achieved. In various examples, the TIM 204 can be applied directly to the die 206 and, thereafter, the upper layer 210 can be applied directly to the TIM 204. In various other examples, the TIM 204 can be applied directly to the upper layer 210 and, thereafter, the die 206 can be applied directly to the TIM 204. In various examples, after application of the TIM 204, the TIM 204 can be in direct contact with the die 206 and the upper layer 210. In certain embodiments, the application of the TIM 204 may be limited to the surfaces of the die 206 such that the TIM 204 can be efficiently used.

As used in this specification, particularly in connection with layers, films, or materials, the terms "on," "onto," "over," and variants thereof (e.g., "applied on," "formed on," "deposited on," "provided on," "located on," and the like) mean applied, formed, deposited, provided, or otherwise located over a surface of a substrate but not necessarily in contact with the surface of the substrate. For example, a TIM "applied on" a substrate does not preclude the presence of another layer or other layers of the same or different composition located between the applied TIM and the substrate. Likewise, a second layer "applied on" a first layer does not preclude the presence of another layer or other layers of the same or different composition located between the applied second layer and the applied TIM.

The circuit assembly 200 can be compressed. For example, referring to the detailed views in FIGS. 3A-3B, the die 206 and the upper layer 210 can be urged together such that a first distance, $d_1$, can decrease to a second, bondline distance, $d_{b1}$. The average particle size of the liquid metal droplets 312 in the TIM 204 prior to applying and/or a compressing process can be selected to be greater than a desired bondline distance, $d_{b1}$, formed between the die 206 and the upper layer 210. For example, the average particle size of the liquid metal droplets 312 prior to applying and/or a compressing process can be greater than the bondline distance, $d_{b1}$, such as, for example, 1% greater than the bondline distance, $d_{b1}$, 2% greater than the bondline distance, $d_{b1}$, 5% greater than the bondline distance, $d_{b1}$, 10% greater than the bondline distance, $d_{b1}$, 15% greater than the bondline distance, $d_{b1}$, 20% greater than the bondline distance, $d_{b1}$, 30% greater than the bondline distance, $d_{b1}$, 40% greater than the bondline distance, $d_{b1}$, 50% greater than the bondline distance, $d_{b1}$, or 75% greater than the bondline distance, $d_{b1}$. The average particle size of the liquid metal droplets 312 prior to applying and/or a compressing process can be no more than 100% greater than the bondline distance, $d_{b1}$, such as, for example, no more than 75% greater than the bondline distance, $d_{b1}$, no more than 50% greater than the bondline distance, $d_{b1}$, no more than 40% greater than the bondline distance, $d_{b1}$, no more than 30% greater than the bondline distance, $d_{b1}$, no more than 20% greater than the bondline distance, $d_{b1}$, no more than 15% greater than the bondline distance, $d_{b1}$, no more than 10% greater than the bondline distance, $d_{b1}$, no more than 5% greater than the bondline distance, $d_{b1}$, or no more than 2% greater than the bondline distance, $d_{b1}$. The average particle size of the liquid metal droplets 312 prior to applying and/or a compressing process can be in a range of 1% to 100% greater than the bondline distance, $d_{b1}$, such as, for example, 1% to 50% greater than the bondline distance, $d_{b1}$, 1% to 30% greater than the bondline distance, $d_{b1}$, 2% to 30% greater than the bondline distance, $d_{b1}$, or 5% to 20% greater than the bondline distance, $d_{b1}$.

Figure 3A:
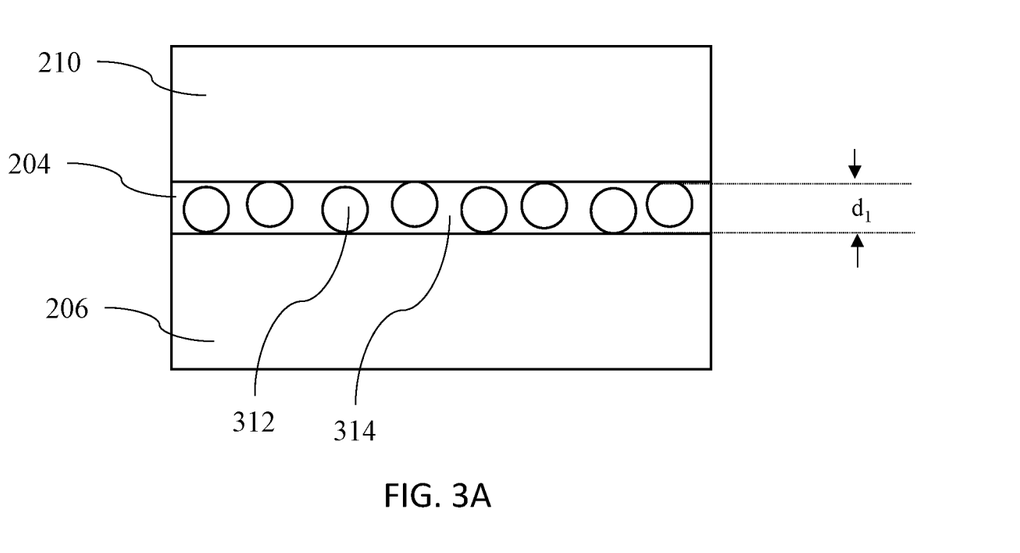
FIG. 3A is a detail view of area 3A of the circuit assembly in FIG. 2 prior to compressing the circuit assembly.
Figure 3B:
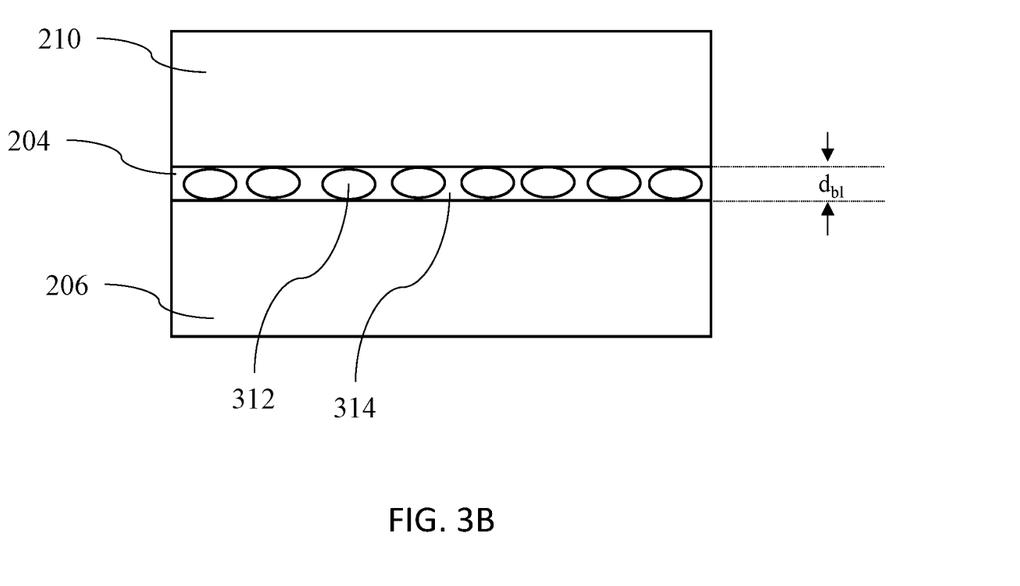
FIG. 3B is the circuit assembly of FIG. 3A after compressing the circuit assembly.

Compressing the circuit assembly 200 can apply a force to the TIM 204 and can deform the liquid metal droplets 312 dispersed within the polymer 314 of the TIM 204. Since the TIM 204 is in the uncured state, the polymer is still conformable and moveable such that the compressing force can deform the liquid metal droplets 312. The liquid metal droplets 312 can be in the liquid phase during deformation such that a lower pressure is required for the compression and a desired deformation is achieved.

The liquid metal droplets 312 can be generally spherical as shown in FIG. 3A and thereafter can be generally ellipsoidal as shown in FIG. 3B. In various examples, the liquid metal droplets 312 prior to compressing can have a first average aspect ratio and after compressing the liquid metal droplets 312 can have a second average aspect ratio. The second average aspect ratio can be different that the first average aspect ratio. For example, the second average aspect ratio can be greater than the first average aspect ratio. The average aspect ratio can be a mean ratios of the width of the liquid metal droplets 312 to the height of the liquid metal droplets 312. In various examples, the first aspect ratio can be 1 and the second aspect ratio can be greater than 1. In certain embodiments, the first aspect ratio can be in a range of 1 to 1.5. In certain embodiments, the second aspect ratio can be at least 0.5 greater than the first aspect ratio, such as, for example, at least 1 greater than the first aspect ratio, at least 2 greater than the first aspect ratio, or at least 5 greater than the first aspect ratio. The width of the liquid metal droplets 312 can be substantially aligned with the longitudinal plane of the TIM 204 in the circuit assembly 200 and the height of the liquid metal droplets 312 can be substantially aligned with the thickness of the TIM 204 (e.g., the distance, $d_1$). The width of the liquid metal droplets 312 can increase upon compression of the circuit assembly 200. For example, in certain embodiments, the radius of a spherical liquid metal droplets prior to compressing can be 100 μm (e.g., first aspect ratio of 1) and after compression to a bondline thickness of 20 μm, the liquid metal drop can be deformed to an ellipsoidal shape with a 316 μm width (e.g., second aspect ratio of 15.6).

In certain examples, the liquid metal droplets 312 can be aligned in a substantially monolayer as shown in FIG. 3B after compressing. The monolayer can be achieved by selecting the average particle size of the liquid metal droplets 312 and the bondline distance, $d_{b1}$. Configuring the liquid metal droplets 312 in a monolayer can reduce the thermal resistance of the TIM 204.

The TIM 204 can be cured thereby forming the circuit assembly 200. Curing the TIM 204 can increase the viscosity of the polymer 316 and can harden the polymer 316. For example, the polymer 316 can become a solid. In various examples, the polymer 314 after curing is elastomeric. Curing the polymer 314 can inhibit pump out of the liquid metal droplets 312 during thermal cycling of the circuit assembly 200 and can provide a mechanical bond between the die 206 and the upper layer 210.

The assembly 200 can comprise a bondline distance, $d_{b1}$, formed between the die 206 and the upper layer 210 in the cured assembly that is no greater than 150 microns, such as, for example, no greater than 145 microns, no greater than 140 microns, no greater than 120 microns, no greater than 100 microns, no greater than 80 microns, no greater than 70 microns, no greater than 50 microns, no greater than 40 microns, no greater than 35 microns, or no greater than 30 microns. The assembly 200 can comprise a bondline distance, $d_{b1}$, formed between the die 206 and the upper layer 210 in the cured assembly that is at least 15 microns, such as, for example, at least 30 microns, at least 35 microns, at least 40 microns, at least 50 microns, at least 70 microns, at least 80 microns, at least 100 microns, at least 120 microns, at least 140 microns, or at least 145 microns. The assembly 200 can comprise a bondline distance, $d_{b1}$, formed between the die 206 and the upper layer 210 in the cured assembly that is in a range of 15 microns to 150 microns, such as, for example, 15 microns to 90 microns, 15 microns to 70 microns, 30 microns to 70 microns, 35 microns to 70 microns, or 15 microns to 100 microns.

The curing can occur for a first time period and the compressing can occur for a second time period. The first time period can be after of at least partially overlap with the second time period. For example, the liquid metal droplets 312 may be deformed prior to substantial curing of the polymer 314 such that a lower compression pressure may be used to deform the liquid metal droplets 312.

The average particle size and deformation of the liquid droplets 312 can improve the thermal resistance value of the TIM 204. For example, the TIM 204 after curing can comprise a thermal resistance value of no greater than 30 (° K*mm$^2$)/W, such as, for example, no greater than 20 (° K*mm$^2$)/W, no greater than 15 (° K*mm)/W, no greater than 10 (° K*mm$^2$)/W, no greater than 9 (° K*mm$^2$)/W, no greater than 8 (° K*mm$^2$)/W, no greater than 7 (° K*mm$^2$)/W, or no greater than 5 (° K*mm$^2$)/W. The TIM 204 after curing can comprise a thermal resistance value of at least 0.5 (° K*mm$^2$)/W, such as, for example, at least 1 (° K*mm$^2$)/W, at least 2 (° K*mm$^2$)/W, at least 3 (° K*mm$^2$)/W, at least 5 (° K*mm$^2$)/W, or at least 10 (° K*mm$^2$)/W. The TIM 204 after curing can comprise a thermal resistance value in a range of 0.5 (° K*mm$^2$)/W to 30 (° K*mm$^2$)/W, such as, for example, 0.5 (° K*mm$^2$)/W to 20 (° K*mm$^2$)/W, 0.5 (° K*mm$^2$)/W to 15 (° K*mm$^2$)/W, 1 (° K*mm$^2$)/W to 10 (° *mm$^2$)/W, 2 (° K*mm$^2$)/W, to 10 (° K*mm$^2$)/W, or 2 (° K*mm$^2$)/W to 8 (° K*mm$^2$)/W. The thermal resistance value can be measured using a DynTIM-S instrument available from Siemens (Munich, Germany), a TIMA instrument from NanoTest (Germany), and/or a LongWin LW 9389 (Taiwan).

The die 206 can comprise, for example, an integrated circuit, such as a processor or an ASIC, or a system-on-a-chip (SOC). The upper layer 210 can be an integrated heat spreader. The TIM 204 can be applied directly between the processor and the integrated heat spreader. For example, the TIM 204 can be a TIM1, a TIM 1.5, or a combination thereof. A TIM1 can be used to thermally connect a die and an integrated heat spreader in a lidded package. A TIM1.5 can be used to thermally connect a die to a heat sink in a bare die package.

Figure 2B:
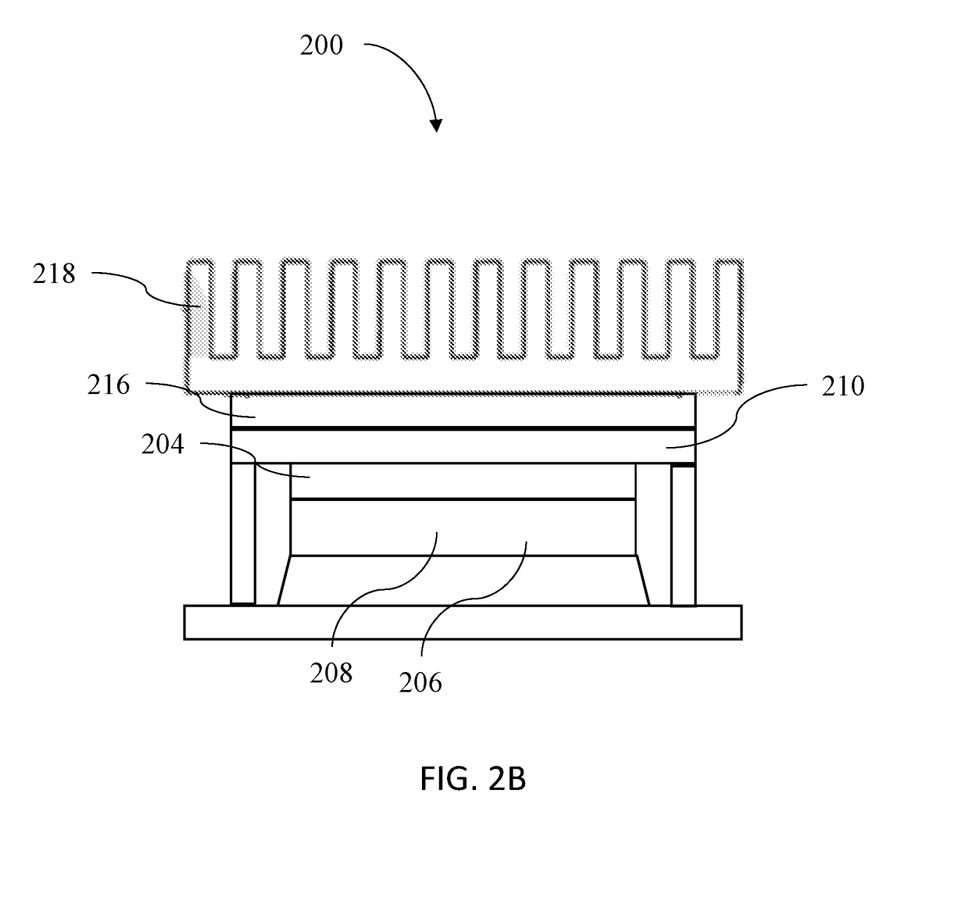
FIG. 2B is a side cross-section view of a circuit assembly comprising a TIM according to the present disclosure.

In various other examples, referring to FIG. 2B, a TIM 216 can be applied between the upper layer 210 (e.g., integrated heat spreader) and a different upper layer 218. The upper layer 218 can comprise a heat sink. For example, the TIM 216 can be a TIM2.

In various other examples, the TIM according to the present disclosure can be used in a system on a package. For example, a single horizontal TIM layer can be in contact with multiple dies on one side (e.g., the integrated circuit can comprise multiple dies or multiple integrated circuits can be in contact with the same side of the TIM) and a upper layer or layers on a different side.

EXAMPLES

Figure 4:
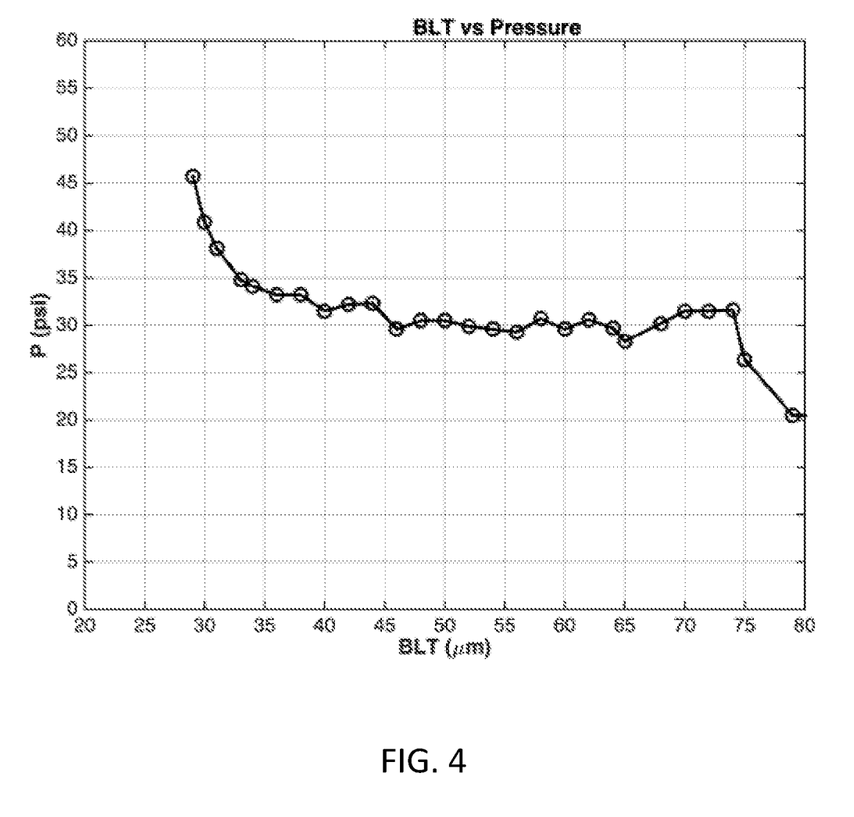
FIG. 4 is a graph illustrating bondline thickness (BLT) versus pressure applied to an uncured assembly according to the present disclosure.

A eutectic alloy of Gallium, Indium, and Tin (Galinstan) (melting temperature, $T_m=19°$ C.) was dispersed into an elastomer using shear mixing to prepare an uncured TIM emulsion of liquid metal droplets comprising an average particle size of 30 microns. The Galinstan loading was 50% by volume of the uncured TIM emulsion. The uncured TIM emulsion was applied on a heat generating device (e.g., die) and was compressed between the heat sink and the die in the uncured state until a desired bondline thickness (BLT) was achieved to form an uncured assembly. While compressing the uncured TIM between the heat sink and the die, the pressure used for the compression was measured at the respective bondline thickness and the results are shown in FIG. 4. As illustrated, the pressure for compression was no greater than 50 pounds per square inch gauge (psig) during compression from a BLT of 80 microns to 29 microns which is applicable for various packaging equipment.

Since Galinstan remains in the liquid phase during compression, a far-field mechanical deformation can deform the liquid metal droplets in the uncured TIM emulsion which can enhance directional heat dissipation properties of the TIM. For example, the thermal conductivity of the uncured TIM emulsion can increase 50× in the direction of strain.

Figure 5:
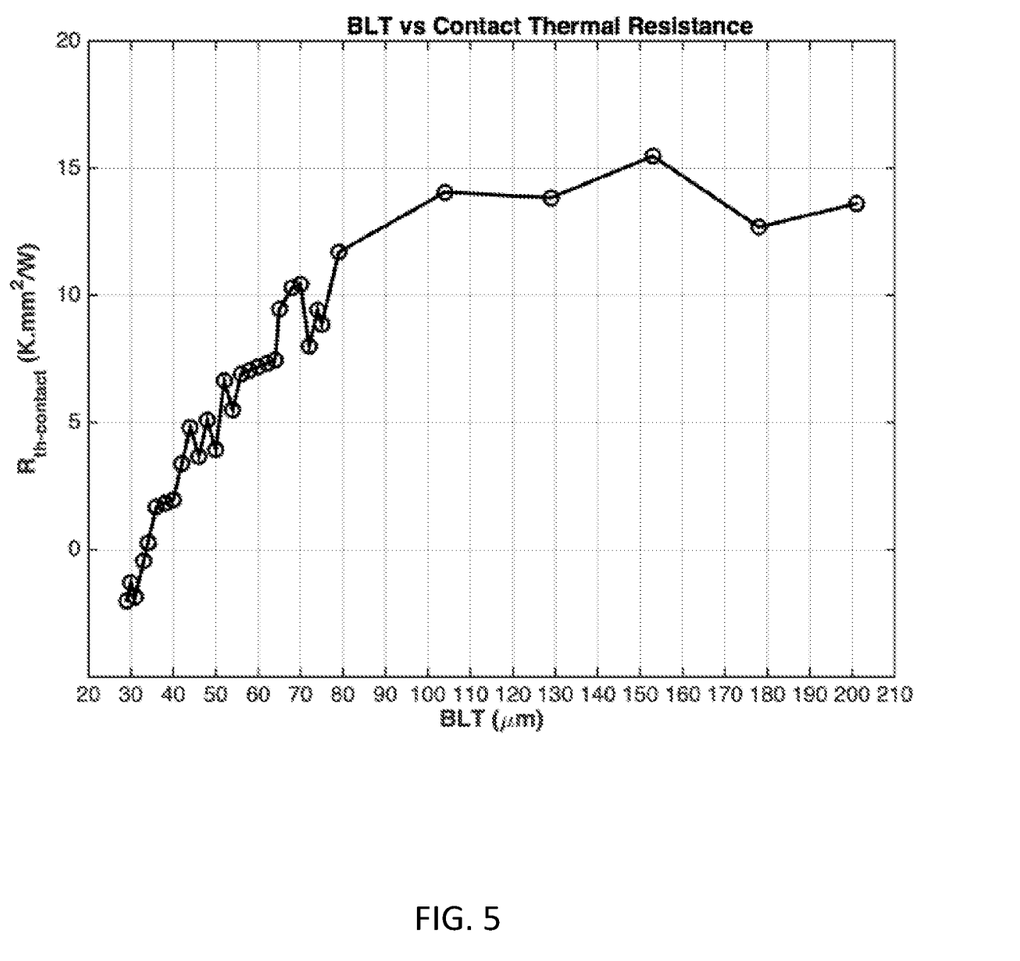
FIG. 5 is a graph illustrating BLT versus contact thermal resistance of cured assemblies according to the present disclosure.

Additional uncured assemblies were prepared according to the method described above with BLTs ranging from 29 microns to 200 microns. The contact thermal resistance of the uncured assemblies were measured using Siemens T3Ster equipment and the results are shown in FIG. 5. As illustrated in FIG. 5, the contact thermal resistance surprisingly changes at 80 microns and approaches effectively zero contact resistance at a BLT of 29 microns indicating an enhanced thermal interface in the uncured assembly when the BLT is no greater than the average particle size of the liquid metal droplets in the TIM emulsion. It is believe that the contact thermal resistance will change minimally, if at all, after curing the TIM emulsion. Additionally, it is believe other inventive assemblies according to the present disclosure can achieve an enhanced thermal interface when the BLT is no greater than the average particle size of liquid metal droplets in the TIM emulsion used in the respective inventive example.

The total thermal resistance, including the contact thermal resistance, through the uncured TIM emulsion in an uncured assembly comprising a BLT of 29 microns was measured to be 30 K*mm$^2$/W. It is believe other inventive assemblies according to the present disclosure can achieve an enhanced thermal resistance properties.

Those skilled in the art will recognize that the herein described compositions, articles, methods, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

With respect to the appended claims, those skilled in the art will appreciate that recited operations therein may generally be performed in any order. Also, although various operational flows are presented in a sequence(s), it should be understood that the various operations may be performed in other orders than those that are illustrated or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

Although various examples have been described herein, many modifications, variations, substitutions, changes, and equivalents to those examples may be implemented and will occur to those skilled in the art. Also, where materials are disclosed for certain components, other materials may be used. It is therefore to be understood that the foregoing description and the appended claims are intended to cover all such modifications and variations as falling within the scope of the disclosed examples. The following claims are intended to cover all such modification and variations.

Various aspects of the invention according to the present disclosure include, but are not limited to, the aspects listed in the following numbered clauses.

1. A method comprising: applying a thermal interface material on a die of an integrated circuit, such that the thermal interface material is between the die and an upper layer of a circuit assembly, wherein the thermal interface material applied to the die comprises an emulsion of liquid metal droplets and uncured polymer; compressing the circuit assembly thereby deforming the liquid metal droplets; and curing the thermal interface material thereby forming a cured assembly.

2. The method of clause 1, wherein the die comprises a processor.

3. The method of any one of clauses 1-2, wherein the upper layer comprises the integrated heat spreader of the processor.

4. The method of any one of clauses 1-2, wherein the upper layer comprises a heat sink, an integrated heat spreader, or packaging.

5. The method of any one of clauses 1-4, wherein a bondline distance formed between the die and the upper layer in the cured assembly is no greater than 150 microns.

6. The method of any one of clauses 1-5, wherein a bondline distance formed between the die and the upper layer in the cured assembly is no greater than 100 microns.

7. The method of any one of clauses 1-6, wherein a bondline distance formed between the die and the upper layer in the cured assembly is no greater than 70 microns.

8. The method of any one of clauses 1-7, wherein a bondline distance formed between the die and the upper layer in the cured assembly is in a range of 15 microns to 90 microns.

9. The method of any one of clauses 1-8, wherein an average particle size of the liquid metal droplets in thermal interface material prior to applying is greater than a bondline distance formed between the die and the upper layer in the cured assembly.

10. The method of any one of clauses 1-9, wherein an average size of the liquid metal droplets in thermal interface material prior to depositing is in a range of 1% to 100% greater than a bondline distance formed between the die and the upper layer in the cured assembly.

11. The method of any one of clauses 1-10, wherein the liquid metal droplets comprise gallium, a gallium alloy, indium, an indium alloy, tin, a tin alloy, mercury, a mercury alloy, or a combination thereof.

12. The method of any one of clauses 1-11, wherein the liquid metal droplets are in a liquid phase at least at a temperature in a range of −19 degrees Celsius to 30 degrees Celsius.

13. The method of any one of clauses 1-12, wherein the thermal interface material after curing comprises a thermal resistance value of no greater than 30 ($° K*mm^2$)/W.

14. The method of any one of clauses 1-13, wherein the thermal interface material after curing comprises a thermal resistance value of no greater than 10 ($° K*mm^2$)/W.

15. The method of any one of clauses 1-14, wherein the liquid metal droplets comprises a unimodal polydispersity.

16. The method of any one of clauses 1-14, wherein the liquid metal droplets comprise a multimodal polydispersity.

17. The method of any one of clauses 1-16, wherein the polymer comprises a thermosetting polymer.

18. The method of any one of clauses 1-17, wherein the polymer comprises a thermoplastic polymer.

19. The method of any one of clauses 1-18, wherein the emulsion has a viscosity of less than 250,000 cP prior to curing.

20. The method of any one of clauses 1-19, wherein the liquid metal droplets are generally spherical prior to depositing and the liquid metal droplets are generally ellipsoidal after compressing the assembly.

21. The method of any one of clauses 1-20, wherein the curing occurs for a first time period and the compressing occurs for a second time period, wherein the first time period is after or at least partially overlaps with the second time period.

22. An integrated circuit assembly produced by the method of any one of clauses 1-21.

23. An integrated circuit assembly comprising: a die; an upper layer; and a thermally interface material disposed in contact with the die layer and the upper layer, wherein the upper material comprises a polymer and liquid metal droplets dispersed throughout the polymer, wherein a bondline distance formed between the die and the upper layer is no greater than 150 microns.

24. The assembly of clause 23, wherein the die comprises a processor.

25. The assembly of any one of clauses 23-24, wherein the upper layer comprises a heat sink, an integrated heat spreader, or packaging.

26. The assembly of any one of clauses 23-25, wherein a bondline distance formed between the die and the upper layer in the assembly is no greater than 100 microns.

27. The assembly of any one of clauses 23-26, wherein a bondline distance formed between the die and the upper layer in the assembly is no greater than 70 microns.

28. The assembly of any one of clauses 23-27, wherein a bondline distance formed between the die and the upper layer in the assembly is in a range of 15 microns to 90 microns.

29. The method of any one of clauses 23-28, wherein the liquid metal droplets comprise gallium, a gallium alloy, indium, an indium alloy, tin, a tin alloy, mercury, a mercury alloy, or a combination thereof.

30. The assembly of any one of clauses 23-29, wherein the liquid metal droplets are in a liquid phase at least at a temperature in a range of −19 degrees Celsius to 30 degrees Celsius.

31. The assembly of any one of clauses 23-30, wherein the thermal interface material comprises a thermal resistance value of no greater than 30 (° K*mm$^2$)/W.

32. The assembly of any one of clauses 23-31, wherein the thermal interface material comprises a thermal resistance value of no greater than 10 (° K*mm$^2$)/W.

33. The assembly of any one of clauses 23-32, wherein the liquid metal droplets comprise a unimodal polydispersity.

34. The assembly of any one of clauses 23-32, wherein the liquid metal droplets comprise a multimodal polydispersity.

35. The assembly of any one of clauses 23-34, wherein the polymer comprises a thermosetting polymer.

36. The assembly of any one of clauses 23-35, wherein the polymer comprises a thermoplastic polymer.

37. The assembly of any one of clauses 23-36, wherein the liquid metal droplets are generally ellipsoidal.

38. An apparatus for thermally connecting a die and an upper layer, the apparatus comprising: a container defining a cavity; and an emulsion disposed in the cavity, wherein the emulsion comprises liquid metal droplets and uncured polymer, and wherein the container is configured to enable application of the emulsion onto a die of an integrated circuit.

39. The apparatus of clause 38, wherein the container is a syringe.

40. The apparatus of clause 38, wherein the container is a pillow pack.

41. The apparatus of any one of clauses 38-40, wherein the die comprises a processor.

42. The apparatus of one of clauses 38-41, wherein the upper layer comprises a heat sink, an integrated heat spreader, or packaging.

43. The apparatus of one of clauses 38-42, wherein an average particle size of the liquid metal droplets in the emulsion is greater than a bondline distance to be formed between the die and an upper layer of the integrated circuit.

44. The apparatus of one of clauses 38-43, wherein the liquid metal droplets comprise gallium, a gallium alloy, indium, an indium alloy, tin, a tin alloy, mercury, a mercury alloy, or a combination thereof.

45. The apparatus of one of clauses 38-44, wherein the liquid metal droplets are in a liquid phase at least at a temperature in a range of −19 degrees Celsius to 30 degrees Celsius.

46. The apparatus of one of clauses 38-45, wherein the liquid metal droplets comprise a unimodal polydispersity.

47. The apparatus of one of clauses 38-45, wherein the liquid metal droplets comprise a multimodal polydispersity.

48. The apparatus of one of clauses 38-47, wherein the polymer comprises a thermosetting polymer.

49. The apparatus of one of clauses 38-48, wherein the emulsion has a viscosity of less than 250,000 cP prior to curing.

50. The apparatus of one of clauses 38-49, wherein the liquid metal droplets are generally spherical.

51. A method comprising: applying a thermal interface material on a first layer, such that the thermal interface material is between a first layer and a second layer of an assembly, wherein the thermal interface material comprises an emulsion of liquid metal droplets and uncured polymer; compressing the assembly thereby deforming the liquid metal droplets; and curing the thermal interface material thereby forming a cured assembly.

Various features and characteristics are described in this specification to provide an understanding of the composition, structure, production, function, and/or operation of the invention, which includes the disclosed compositions, coatings, and methods. It is understood that the various features and characteristics of the invention described in this specification can be combined in any suitable manner, regardless of whether such features and characteristics are expressly described in combination in this specification. The Inventors and the Applicant expressly intend such combinations of features and characteristics to be included within the scope of the invention described in this specification. As such, the claims can be amended to recite, in any combination, any features and characteristics expressly or inherently described in, or otherwise expressly or inherently supported by, this specification. Furthermore, the Applicant reserves the right to amend the claims to affirmatively disclaim features and characteristics that may be present in the prior art, even if those features and characteristics are not expressly described in this specification. Therefore, any such amendments will not add new matter to the specification or claims and will comply with the written description, sufficiency of description, and added matter requirements.

Any numerical range recited in this specification describes all sub-ranges of the same numerical precision (i.e., having the same number of specified digits) subsumed within the recited range. For example, a recited range of "1.0 to 10.0" describes all sub-ranges between (and including) the recited minimum value of 1.0 and the recited maximum value of 10.0, such as, for example, "2.4 to 7.6," even if the range of "2.4 to 7.6" is not expressly recited in the text of the specification. Accordingly, the Applicant reserves the right to amend this specification, including the claims, to expressly recite any sub-range of the same numerical precision subsumed within the ranges expressly recited in this specification. All such ranges are inherently described in this specification such that amending to expressly recite any such sub-ranges will comply with the written description, sufficiency of description, and added matter requirements.

Also, unless expressly specified or otherwise required by context, all numerical parameters described in this specification (such as those expressing values, ranges, amounts, percentages, and the like) may be read as if prefaced by the word "about," even if the word "about" does not expressly appear before a number. Additionally, numerical parameters described in this specification should be construed in light of the number of reported significant digits, numerical precision, and by applying ordinary rounding techniques. It is also understood that numerical parameters described in this specification will necessarily possess the inherent variability characteristic of the underlying measurement techniques used to determine the numerical value of the parameters.

Notwithstanding that numerical ranges and parameters setting forth the broad scope of the invention are approximations, numerical values set forth in the specific examples are reported precisely as possible. Any numerical value, however, inherently contains certain errors necessarily resulting from the standard variation found in its respective testing measurements.

Reference throughout the specification to "various examples," "some examples," "one example," "an example," or the like means that a particular feature, structure, or characteristic described in connection with the example is included in an example. Thus, appearances of the phrases "in various examples," "in some examples," "in one example," "in an example," or the like, in places throughout the specification are not necessarily all referring to the same example. Furthermore, the particular features, structures, or characteristics may be combined in any suitable manner in an example or examples. Thus, the particular features, structures, or characteristics illustrated or described in connection with one example may be combined, in whole or in part, with the features, structures, or characteristics of another example or other examples without limitation. Such modifications and variations are intended to be included within the scope of the present examples.

Any patent, publication, or other document identified in this specification is incorporated by reference into this specification in its entirety unless otherwise indicated but only to the extent that the incorporated material does not conflict with existing descriptions, definitions, statements, illustrations, or other disclosure material expressly set forth in this specification. As such, and to the extent necessary, the express disclosure as set forth in this specification supersedes any conflicting material incorporated by reference. Any material, or portion thereof, that is incorporated by reference into this specification, but which conflicts with existing definitions, statements, or other disclosure material set forth herein, is only incorporated to the extent that no conflict arises between that incorporated material and the existing disclosure material. Applicant reserves the right to amend this specification to expressly recite any subject matter, or portion thereof, incorporated by reference. The amendment of this specification to add such incorporated subject matter will comply with the written description, sufficiency of description, and added matter requirements.

Whereas particular examples of this invention have been described above for purposes of illustration, it will be evident to those skilled in the art that numerous variations of the details of the present invention may be made without departing from the invention as defined in the appended claims.

While the present disclosure provides descriptions of various specific aspects for the purpose of illustrating various aspects of the present disclosure and/or its potential applications, it is understood that variations and modifications will occur to those skilled in the art. Accordingly, the invention or inventions described herein should be understood to be at least as broad as they are claimed and not as more narrowly defined by particular illustrative aspects provided herein.

It is understood that the inventions described in this specification are not limited to the examples summarized in the Summary or Detailed Description. Various other aspects are described and exemplified herein.

What is claimed is:

1. An integrated circuit assembly comprising:
a die;
an upper layer; and
a thermally interface material disposed in contact with the die and the upper layer, wherein the thermal interface material comprises a polymer and liquid metal droplets dispersed throughout the polymer, wherein a bondline distance formed between the die and the upper layer is no greater than 150 microns, wherein the liquid metal droplets are in a liquid phase at least at a temperature in a range of −19 degrees Celsius to 30 degrees Celsius.

2. The assembly of claim 1, wherein the liquid metal droplets comprise gallium, a gallium alloy, indium, an indium alloy, tin, a tin alloy, mercury, a mercury alloy, or a combination thereof.

3. The assembly of claim 1, wherein the thermal interface material comprises a thermal resistance value of no greater than 30 ($° K*mm^2$)/W.

4. The assembly of claim 1, wherein the polymer comprises a thermosetting polymer.

5. The assembly of claim 1, wherein the polymer comprises a thermoplastic polymer.

6. The assembly of claim 1, wherein the liquid metal droplets are generally ellipsoidal.

7. The assembly of claim 1, wherein the die comprises a processor.

8. The assembly of claim 1, wherein the upper layer comprises a heat sink, an integrated heat spreader, or packaging.

9. The assembly of claim 1, wherein a bondline distance formed between the die and the upper layer in the assembly is no greater than 100 microns.

10. The assembly of claim 1, wherein a bondline distance formed between the die and the upper layer in the assembly is no greater than 70 microns.

11. The assembly of claim 1, wherein a bondline distance formed between the die and the upper layer in the assembly is in a range of 15 microns to 90 microns.

12. The assembly of claim 1, wherein the thermal interface material comprises a thermal resistance value of no greater than 10 ($° K*mm^2$)/W.

13. The assembly of claim 1, wherein the liquid metal droplets comprise a unimodal polydispersity.

14. The assembly of claim 1, wherein the liquid metal droplets comprise a multimodal polydispersity.

15. The assembly of claim 1, wherein the liquid metal droplets have an aspect ratio greater than 1.

16. The assembly of claim 1, wherein the liquid metal droplets have an aspect ratio greater than 2 and the width of the liquid metal droplets is substantially aligned with a longitudinal place of the thermal interface material.

* * * * *